（12）United States Patent
Iwamatsu

(10) Patent No.: US 8,149,057 B2
(45) Date of Patent: Apr. 3, 2012

(54) SIGNAL PROCESSING CIRCUIT

(75) Inventor: Masayuki Iwamatsu, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 12/931,098

(22) Filed: Jan. 25, 2011

(65) Prior Publication Data

US 2011/0181362 A1 Jul. 28, 2011

(30) Foreign Application Priority Data

Jan. 26, 2010 (JP) ................. 2010-013872

(51) Int. Cl.
H03G 3/00 (2006.01)

(52) U.S. Cl. .................. 330/282; 330/284; 330/149

(58) Field of Classification Search .................. 330/282, 330/284, 149
See application file for complete search history.

(56) References Cited

U.S. PATENT DOCUMENTS

| 4,376,267 | A | * | 3/1983 | Chu et al. ....................... 330/284 |
| 4,721,923 | A | * | 1/1988 | Bares et al. .................... 330/284 |
| 6,288,610 | B1 | * | 9/2001 | Miyashita ....................... 330/149 |
| 6,922,103 | B2 | * | 7/2005 | Cheung et al. ................. 330/149 |
| 7,482,870 | B2 | * | 1/2009 | Maejima et al. ........... 330/207 P |
| 2008/0297257 | A1 | | 12/2008 | Iwamatsu |
| 2010/0244966 | A1 | * | 9/2010 | Morishima ................... 330/278 |
| 2011/0063027 | A1 | * | 3/2011 | Kishii et al. ................... 330/251 |

FOREIGN PATENT DOCUMENTS

| JP | 10163769 A | 6/1998 |
| JP | 2008301035 A | 12/2008 |

* cited by examiner

Primary Examiner — Patricia Nguyen
(74) Attorney, Agent, or Firm — Pillsbury Winthrop Shaw Pittman LLP

(57) ABSTRACT

A signal processing circuit includes a waveform shaping section that applies a first gain to an input signal and generates a first signal when an absolute value of a level of the input signal falls within a first input range from a first level to a second level, a variable gain section that adjusts an amplitude of the first signal and amplifies the first signal by a gain to generate an output signal, and a control section that reduces the gain of the variable gain section so that the output signal is prevented from occurrence of clipping when the amplitude of the first signal falls within a second input range. The second input range includes a range of the level of the first signal output from the waveform shaping section corresponding to the first input range of the input signal.

6 Claims, 6 Drawing Sheets

SIGNAL PROCESSING CIRCUIT

BACKGROUND

The present invention relates to a signal processing circuit that subjects an input signal to signal processing, thereby generating an output signal, and, more particularly, to a technique of producing an output signal that achieves a balance between a sense of full-bodied sound and distortion.

In a related amplifier, when it is detected that a level of an output signal reaches to a source voltage, an input signal is attenuated, thereby preventing occurrence of clipping, which would otherwise be caused by an input signal having an excessive high level. Patent Document 1 discloses a technique for detecting occurrence of clipping without fail and attenuating an input signal, because it is difficult to make an accurate determination as to whether or not clipping has actually occurred by detection of a level of an output signal.

Patent Document 2 discloses a technique for enhancing a sense of full-bodied sound by allowing a certain degree of clipping in an output signal.

[Patent Document 1] JP-A-10-163769
[Patent Document 2] JP-A-2008-301035

A principal objective of the technique described in Patent Document 1 is to prevent occurrence of clipping. To this end, if clipping occurs or if there is a chance of occurrence of clipping, an input signal will be immediately attenuated. However, such control entails performance of excessive quick attenuation operation, which in turn raises a problem of deficiency in a senses of full-bodied sound.

Meanwhile, the technique described in Patent Document 2 allows a certain degree of clipping and rises a problem of an increase in distortion.

SUMMARY

The present invention has been conceived in light of such a situation, and a problem that the present invention is to resolve is enhancement of a sense of full-bodied sound by reducing distortion of an output signal.

In order to achieve the above object, according to the present invention, there is provided a signal processing circuit comprising:

a waveform shaping section that applies a first gain to an input signal and generates a first signal when an absolute value of a level of the input signal falls within a first input range from a first level to a second level higher than the first level, the first gain being smaller than a second gain which is applied to the input signal when the absolute value of the level of the input signal is smaller than the first level;

a variable gain section that adjusts an amplitude of the first signal and amplifies the first signal by a gain to generate an output signal; and a control section that controls the gain of the variable gain section according to a signal from the variable gain section so that the output signal is prevented from occurrence of clipping, wherein the control section controls to reduce the gain of the variable gain section so that the output signal is prevented from occurrence of clipping when the amplitude of the first signal falls within a second input range; and wherein the second input range includes a range of the level of the first signal output from the waveform shaping section corresponding to the first input range of the input signal.

Preferably, the first gain is monotonically decreased in the first input range.

Preferably, the waveform shaping section has a selection section which switches an input/output characteristic of the waveform shaping section in the first input range according to a type of the input signal.

Preferably, the first gain is generated from a combination of a plurality of resistors and transistors positioned at a feedback stage of an amplifying circuit of the waveform shaping section.

Preferably, the waveform shaping section is configured by an amplifying circuit which enables to select one among a plurality of gains.

Preferably, the first gain is generated from a combination of a plurality of resistors and diodes positioned at a feedback stage of an amplifying circuit of the waveform shaping section.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF EXEMPLARY EMBODIMENTS

First Embodiment

Figure 1:
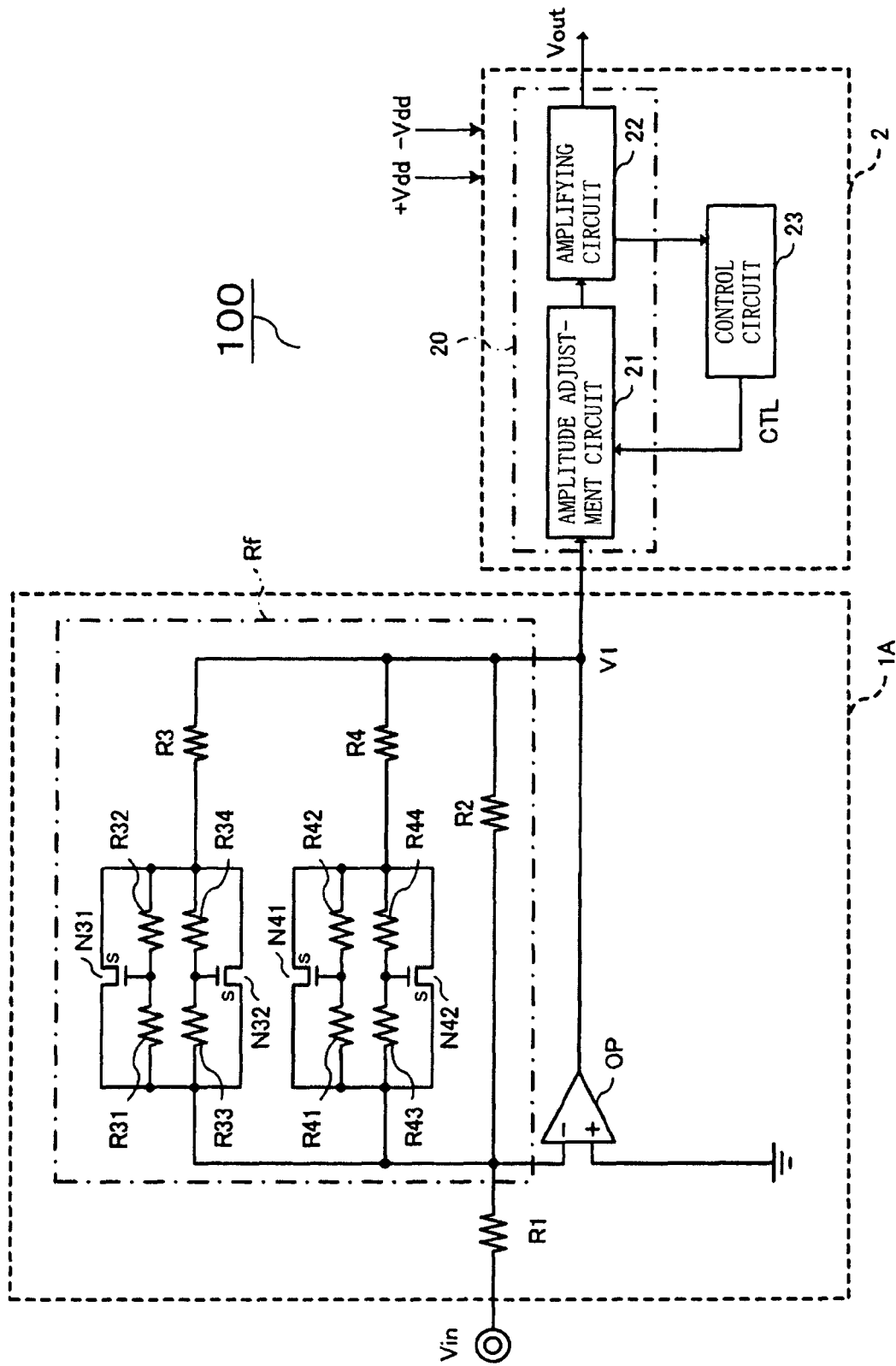
FIG. 1 is a block diagram showing a configuration of a signal processing circuit according to a first embodiment.

An embodiment of the present invention is now described by reference to the drawings. FIG. 1 is a block diagram showing a configuration of a signal processing circuit 100 of the present embodiment. As illustrated, the signal processing circuit 100 has a waveform shaping section 1A that shapes a signal waveform of an input signal Vin according to its level to output a first signal V1 and a non-clip section 2 that amplifies the first signal V1 to output an output signal Vout. The non-clip section 2 is operated by receiving a supply of a source voltage ±Vdd from an unillustrated power source circuit. Consequently, when a level of an output signal Vout has reached ±Vdd, a signal waveform of the output signal is clipped. When the non-clip section 2 detects clipping of the output signal Vout, a gain of the non-clip section 2 operates is decreased.

The waveform shaping section 1A has an operational amplifier OP, an input resistor R1, and a feedback resistor group Rf. A gain G of the waveform shaping section 1A is given by G=−Rf/R1. The feedback resistor group Rf includes resistors R2, R3, R31, R32, R33, R34, R4, R41, R42, R43, and R44 and transistors N31, N32, N41, and N42. The transistors N31 and N32 are activated when the level of the first signal V1 exceeds; for instance, 1.2 volts. The transistors N41 and N42 are activated when the level of the first signal V1 exceeds; for instance, 0.9 volts.

The gain G can be applied with a polygonal line characteristic by appropriately setting the resistance value of the resistors. There may adopted the following settings; for instance, R1=10 kΩ, R2=13 kΩ, R3=1.2 kΩ, R31=R32=R33=R34=100 kΩ, R4=10 kΩ, R41=R44=50 kΩ, and R42=R43=100 kΩ.

Figure 2A:
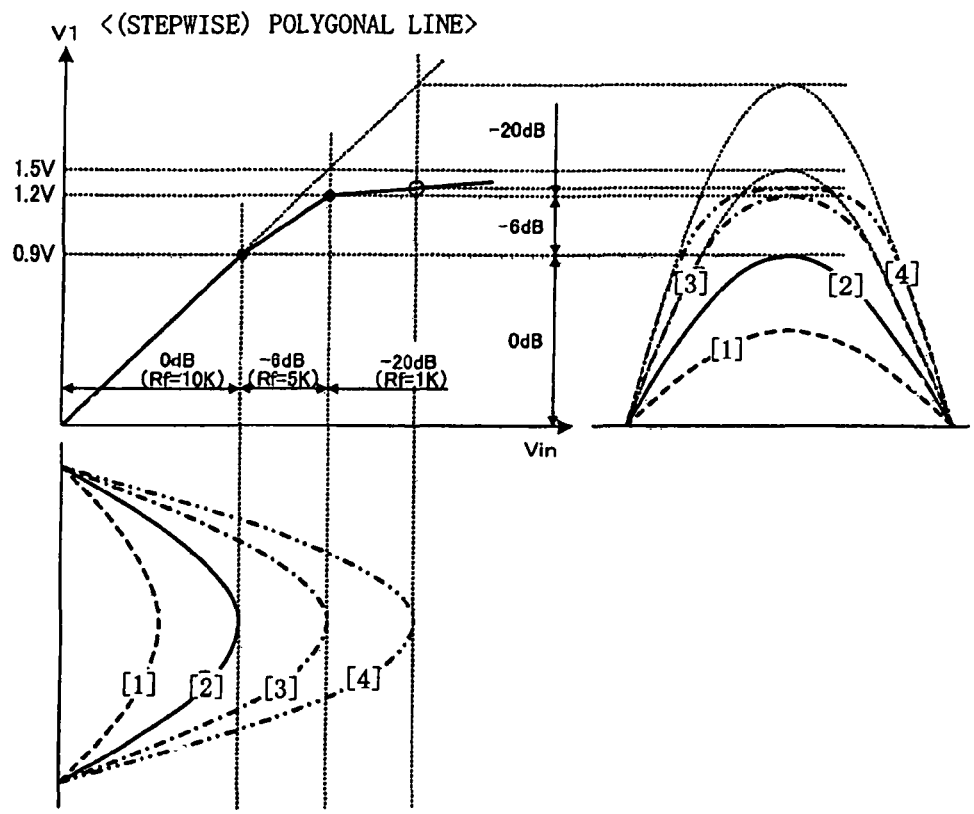
FIGS. 2A and 2B are graphs showing an input/output characteristic of a waveform shaping section of the signal processing circuit.

FIG. 2A shows an input/output characteristic (a polygonal line characteristic) of the waveform shaping section 1A. When an absolute value of a level of the first signal V1 is smaller than 0.9 volts, a combined resistance value of the feedback resistor group Rf comes to 10 kΩ. Further, when the absolute value of the level of the first signal V1 is 0.9 volts or more and smaller than 1.2 volts, the combined resistance value of the feedback resistor group Rf comes to 5 kΩ. Moreover, when the absolute value of the level of the first signal V1 is 1.2 volts or more, the combined resistance value of the feedback resistor group Rf comes to 1 kΩ. As a consequence, when the absolute value of the level of the first signal V1 is smaller than 0.9 volts, the gain comes to 0 dB (a second gain). When the absolute value of the level of the first signal V1 is 0.9 volts or more and smaller than 1.2 volts, the gain G comes to −6 dB. When the absolute value of the level of the first signal V1 is 1.2 volts or more, the gain G comes to −20 dB.

Switching of a gain of the waveform shaping section 1A is controlled by activation or deactivation of the transistors N31, N32, N41, and N42. A waveform [1] and a waveform [2] shown in FIG. 2A are free from distortion. Meanwhile, when the absolute value of the level of the first signal V1 comes to 0.9 volts or more, a gain of the waveform shaping section 1A changes from 0 dB to −6 dB, so that a waveform [3] is shaped into a waveform whose top is flattened. Further, in relation to the waveform [4], when the absolute value of the level of the first signal V1 comes to 1.2 volts or more, the gain changes from −6 dB to −20 dB, so that the top becomes flattened much greater. When the absolute value of the level of the input signal Vin becomes greater (exceeds 0.9 volts), the top of the waveform of the thus-produced first signal V1 becomes flattened. However, unlike a sliced waveform, continuity exists between before and after the top in the waveform; hence, a high degree of distortion is few.

As mentioned above, when the absolute value of the level of the first signal V1 exceeds 1.2 volts, the gain of the waveform shaping section 1A comes to −20 dB. An upper limit at which the gain of the waveform shaping section 1A comes to −20 dB has a ceiling. In the present embodiment, the waveform shaping section 1A normally operates within a range where the absolute value of the level of the first signal V1 is 1.5 volts or less. The level of the input signal Vin corresponding to the level at which the first signal V1 assumes 1.5 volts is 0.9+(1.2−0.9)*2+(1.5−1.2)*10=4.5 volts.

Consequently, when compared with the case where the absolute value of the level of the input signal Vin is smaller than 0.9 volts (a first level), the waveform shaping section 1A applies the input signal Vin with a small gain (a first gain), within an input range (a first input range) where the absolute value of the level of the input signal Vin is 0.9 volts (a first level) or more and at most 4.5 volts (a second level), thereby producing the waveform-shaped first signal V1.

Figure 2B:
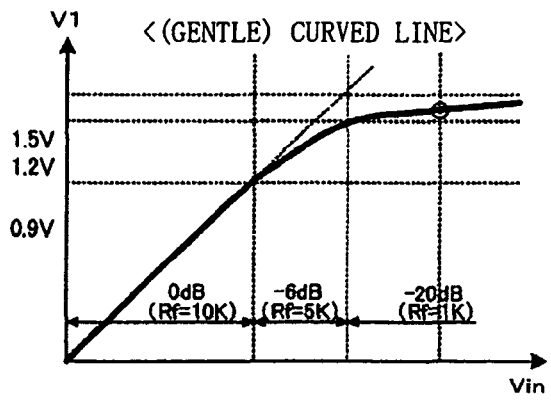

When the transistors N31, N32, N41, and N42 operate as idealistic switches, stepwise changes occur as designated by polygonal lines shown in FIG. 2A. This is a case where a drain current Ids increases stepwise as a gate-source voltage Vgs is increased in connection with a relationship between the drain current Ids of the transistor and the gate-source voltage Vgs. However, an actual transistor has a square characteristic and does not change stepwise. Utilizing the property makes it possible to change an input/output characteristic of the waveform shaping section 1A in the form of a gentle curve as shown in FIG. 2B. As a consequence, a gain change also continues gently, and hence occurrence of distortion can be diminished.

A minimum requirement for the input/output characteristic of the waveform shaping section 1A is to exhibit a monotonous decrease and may assume a stepwise change in the form of a polygonal line as shown in FIG. 2A, or a gentle change in the form of a curve as shown in FIG. 2B.

The non-clip section 2 is now described. As shown in FIG. 1, the non-clip section 2 includes a variable gain section 20 and a control circuit 23. The variable gain section 20 adjusts an amplitude of the first signal V1 while amplifying the first signal V1, thereby producing an output signal Vout. The control circuit 23 controls a gain of the variable gain section 20. As illustrated, the variable gain section 20 has an amplitude adjustment circuit 21 and an amplifying circuit 22. The amplitude adjustment circuit 21 adjusts an amplitude of the first signal V1 according to a control signal CTL and outputs the first signal V1 to the amplifying circuit 22. The amplifying circuit 22 is configured by; for instance, a feedback amplifier using an operational amplifier. The control circuit 23 detects clipping of a waveform of the output signal Vout according to the output signal Vout or a signal originating from a predetermined point of the amplifying circuit 22, and generates the control signal CTL such that the output signal Vout is not clipped. A gain given to the first signal V1 by the variable gain section 20 is thereby adjusted so that the output signal Vout is not clipped.

In a case where the amplifying circuit 22 is configured by use of an operational amplifier, if the output signal Vout is clipped at the source voltage ±Vdd, an imaginary short circuit will not occur between a positive input terminal and a negative input terminal of the operational amplifier. Accordingly, the control circuit 23 can detect occurrence of clipping of the output signal Vout by monitoring a voltage of the negative input terminal of the operational amplifier.

In detail, it is possible to detect clipping by monitoring the potential difference between the positive input terminal and the negative input terminal of the operational amplifier. The potential difference between the positive input terminal and the negative input terminal of the operational amplifier may be detected and the detected potential difference may be compared with the reference potential Vref by a comparator. In case the reference potential Vref is set to 0 V, one of the input terminals of the comparator is connected to the positive input terminal of the operational amplifier and the other input terminal of the comparator is connected to the negative input terminal of the operational amplifier.

Figure 3:
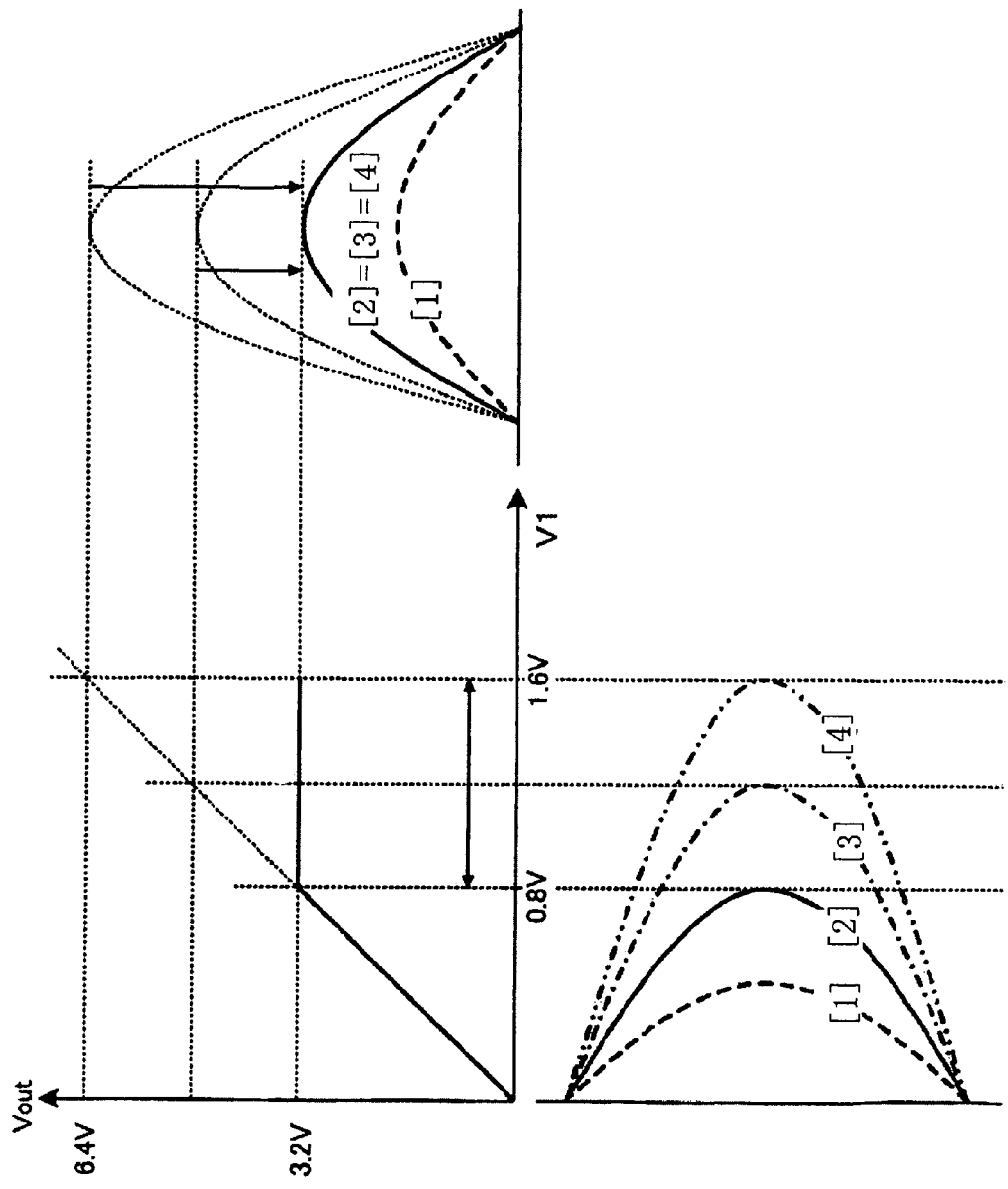
FIG. 3 is a graph showing an input/output characteristic of a non-clip section of the signal processing circuit.

FIG. 3 shows an input/output characteristic of the non-clip section 2. As illustrated, a gain of the non-clip section 2 is four times within a range where the absolute value of the level of the first signal V1 is smaller than 0.8 volts. In the present embodiment, the source voltage ±Vdd is ±3.2 volts. When the level of the output signal Vout reaches ±3.2 volts, clipping occurs.

In a range where the absolute value of the level of the first signal V1 is 0.8 volts or more and at most 1.6 volts (a predetermined range; a second input range), the amplitude adjustment circuit 21 adjusts an amplitude of the first signal V1 such that no clipping occurs in the output signal Vout. As a consequence, a signal waveform of the output signal Vout does not change in the range from 0.8 V to 1.6 V even when a change occurs in the level of the first signal V1 as seen from signal waveforms [2] to [4] shown in FIG. 3.

Figure 4:
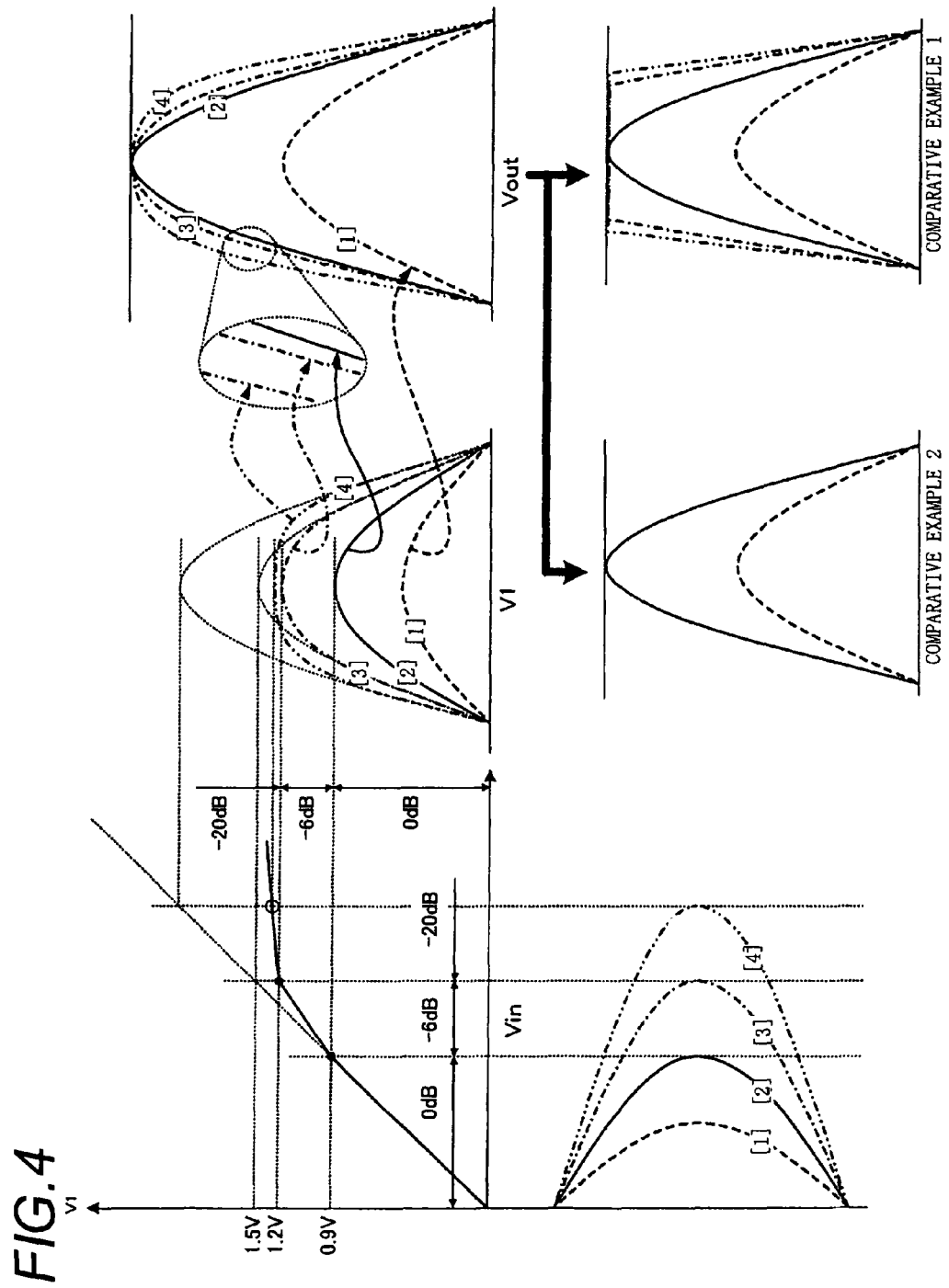
FIG. 4 is a graph showing an entire input/output characteristic of the signal processing circuit.

Now, FIG. 4 shows an input/output characteristic of an entire of the signal processing circuit 100. As shown in FIG. 4, a characteristic of the present embodiment is depicted in the signal waveforms [3] and [4]. Specifically, in the first signal V1 output from the waveform shaping section 1A, peaks of the signal waveforms [3] and [4] are flattened. However, the flattened peaks are not clipped and show gentle changes in the waveforms. Thus, when the first signal V1 is fed to the non-clip section 2, a match occurs between peak values, whilst there can be obtained an output signal Vout whose half bandwidth increases in sequence of a signal waveform from [2], [3], and [4].

Comparative example 1 in FIG. 4 shows an output signal of an ordinary amplifier. When the level of an input signal increases, the output signal is clipped at the source voltage. Since in this case the output signal is sliced at the source voltage, the output signal includes a high order of distortion. Meanwhile, comparative example 2 in FIG. 4 shows an output signal acquired when the input signal Vin is fed directly to the non-clip section 2 without use of the waveform shaping section 1A. In this case, the output signal is not clipped and hence does not include any distortion. However, the output signal is deficient in a sense of full-bodied sound.

On the contrary, when the amplitude of the input signal Vin becomes greater, the output signal Vout of the signal processing circuit 100 undergoes waveform shaping in the waveform shaping section 1A so as to compress the waveform in a region having a predetermined level or more. The first signal V1 subjected to such waveform shaping is amplified so that the output signal Vout is not clipped at the source voltage. As a consequence, since the signal waveform of the output signal Vout is not sliced at the source voltage, the high degree of distortion can be suppressed. Concurrently, when the input signal Vin comes to a predetermined level or more, the signal waveform of the output signal Vout changes while occurrence of clipping is avoided in such a way that the half bandwidth gradually becomes greater. Consequently, when the input signal Vin is excessive, the waveform of the output signal Vout is deformed according to a degree of an excess of the input signal Vin while the output signal Vout is matched to the maximum value that can avoid occurrence of clipping. Therefore, a sense of full-bodied sound can be enhanced while distortion is suppressed.

Figure 5:
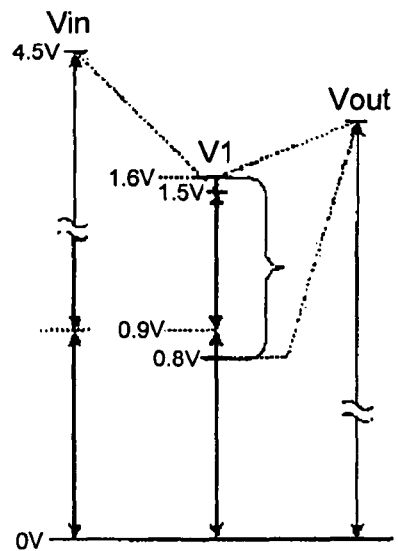
FIG. 5 is a descriptive view showing a relationship between an operating range of the waveform shaping section and an operating range of the non-clip section.

As mentioned above, the reason why the sense of full-bodied sound can be enhanced while distortion is suppressed is that settings are made in such a way that an overlap exists between the range where the waveform shaping section 1A performs waveform shaping and the range where the non-clip section 2 adjusts a gain thereof. FIG. 5 shows a relationship between an operating range of the waveform shaping section 1A and an operating range of the non-clip section 2.

As illustrated in FIG. 5, the waveform shaping section 1A performs waveform shaping for compressing peaks of a signal waveform of the first signal V1 within an input range where the absolute value of the level of the input signal Vin is 0.9 volts (the first level) or more and at most 4.5 volts (the second level). The level of the first signal V1 corresponding to the level (0.9 volts) of the input signal Vin is 0.9 volts. The level of the first signal V1 corresponding to the level (4.5 volts) of the input signal Vin is 1.5 volts.

Meanwhile, the non-clip section 2 adjusts an amplitude of the first signal V1 so that clipping in the output signal Vout does not occur in a predetermined range where the absolute value of the level of the first signal V1 is 0.8 volts or more and at most 1.6 volts.

Specifically, the predetermined range where the non-clip section 2 operates is broader than the range (0.9 volts to 1.5 volts) of the level of the first signal V1 corresponding to the input range of the waveform shaping section 1A. It is thereby possible to enhance a sense of full-bodied sound while suppressing distortion. Although in the present embodiment the predetermined range where the non-clip section 2 operates is broader than the range (0.9 volts to 1.5 volts) of the level of the first signal V1, the predetermined range where the non-clip section 2 and the range of the level of the first signal V1 may coincide with each other. Alternatively, the level of the first signal V1 at which the non-clip section 2 starts operation may match with the level of the first signal V1 at which the waveform shaping section 1A starts waveform shaping. For instance, when the range of the level of the first signal V1 corresponding to the input range is 0.9 volts or more and at most 1.5 volts, the predetermined range can range from 0.9 volts to 1.6 volts.

Figure 6:
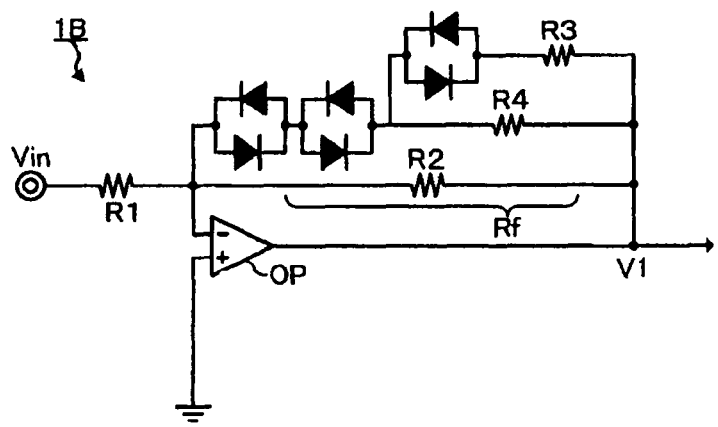
FIG. 6 is a circuit diagram showing another example configuration of the waveform shaping section.

Although the waveform shaping section 1A is configured by the resistors and the transistors in the first embodiment, a waveform shaping section 1B configured by diodes and resistors can also be adopted as shown in FIG. 6. In this case, an input/output characteristic showing a monotonous decrease can be acquired by utilization of a forward voltage of the diode.

Figure 7:
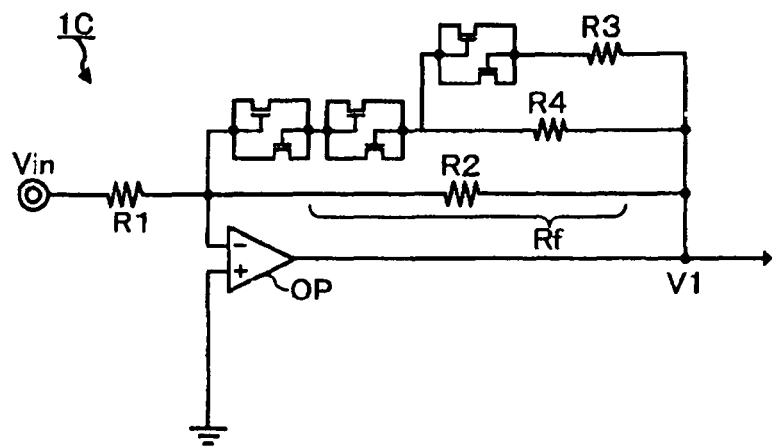
FIG. 7 is a circuit diagram showing still another example configuration of the waveform shaping section.

A waveform shaping section 1C configured by FETs and resistors shown in FIG. 7 can also be adopted. In this case, an input/output characteristic showing a monotonous decrease can be obtained by utilization of a constant voltage circuit made up of a field effect transistor.

Second Embodiment

In the first embodiment, the input/output characteristic of the waveform shaping section 1A is plotted in the form of a stationary polygonal line. By contrast, a waveform shaping characteristic of a waveform shaping section can be switched in the second embodiment.

Figure 8:
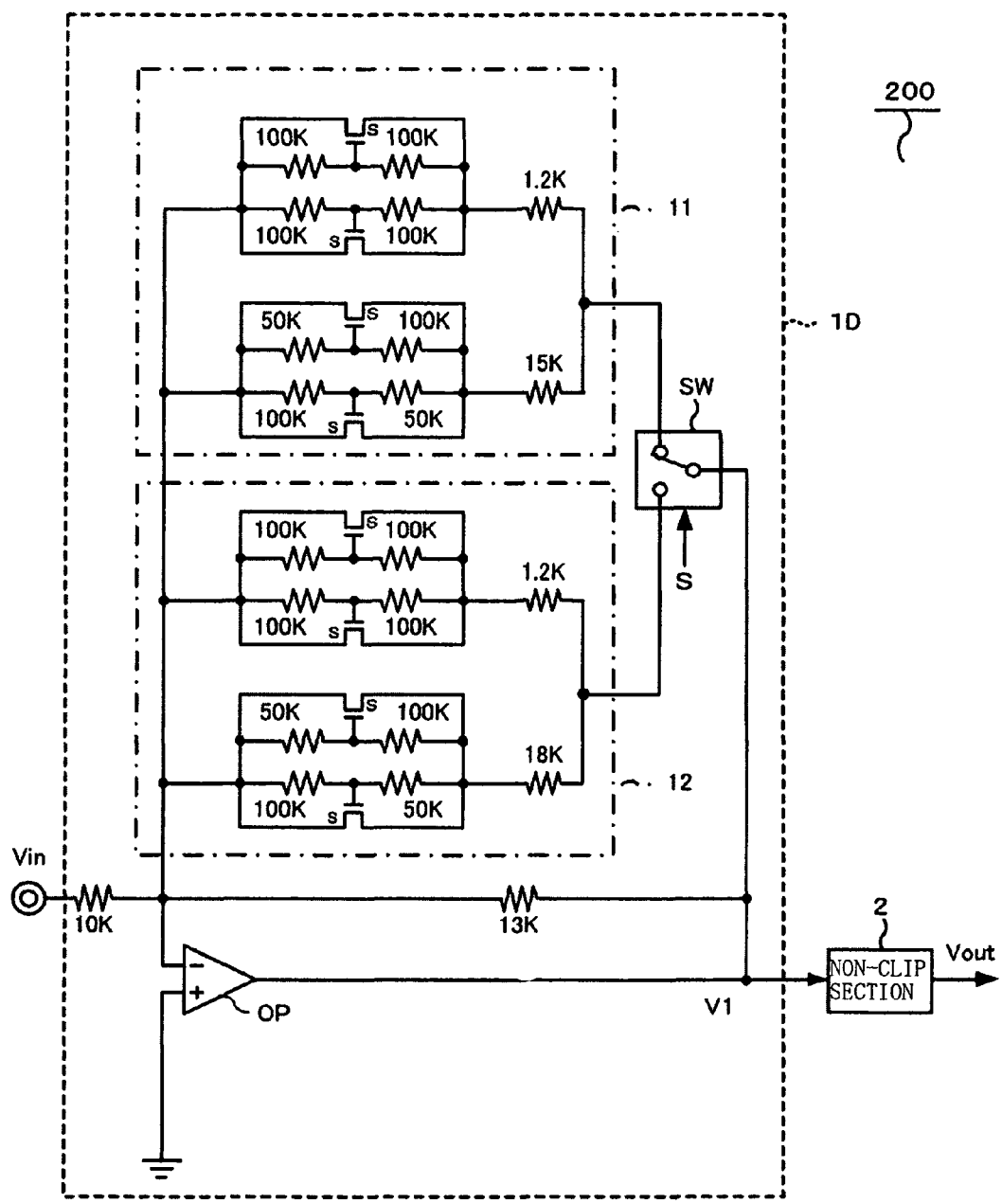
FIG. 8 is a block diagram showing a configuration of a signal processing circuit according to a second embodiment.

FIG. 8 shows a block diagram of a signal processing circuit 200 according to the second embodiment. The signal processing circuit 200 is configured in the same manner as is the signal processing circuit 100 of the first embodiment shown in FIG. 1 except use of a waveform shaping section 1D in place of the waveform shaping section 1A.

In the waveform shaping section 1D, a switch SW selects one of a first resistor group 11 and a second resistor group 12 and connects the thus-selected resistor group to the output terminal of the operational amplifier OP. When the first resistor group 11 is selected, an input/output characteristic analogous to that described in connection with the first embodiment is exhibited, so that the gain comes to −6 dB within a range where the signal level of the first signal V1 changes from 0.9 volts to 1.2 volts. On the contrary, resistors having 18 kΩ are used, in place of the resistors having 15 kΩ, in the second resistor group 12. Therefore, the gain comes to −3 dB within a range where the signal level of the first signal V1 changes from 0.9 volts to 1.2 volts.

Specifically, when the second resistor group 12 is selected, a gain difference of the polygonal line appeared in a second phase can be suppressed when compared with a case where the first resistor group 11 is selected. Consequently, distortion can be lessened. Even in the present embodiment, the essential requirement for the input/output characteristic of the waveform shaping section 1D is to exhibit a monotonous decrease as in the case of the first embodiment. Either a polygonal line involving a stepwise change or a curved line involving a gentle change can also be adopted.

In the present embodiment, the switch SW is controlled by a setting signal S fed from the outside. For instance, when a signal processing circuit 200 is used in a mobile phone having a phone call function and a music reproducing function, a signal used for designating either a phone call status or a music reproducing status may be fed as the setting signal S to the switch SW. When music is reproduced, smaller distortion is more desirable. Therefore, the second resistor group 12 is selected. In the meantime, in the case of a phone call, the first resistance group 11 is selected for giving preference to the sense of full-bodied sound. Alternatively, the input signal Vin may be subjected to frequency analysis, to thus determine whether a phone call or sound reproducing is selected, and the setting signal S may also be generated according to a determination result.

As mentioned above, in the second embodiment, the input/output characteristic of the waveform shaping section 1D is switched according to a type of the input signal Vin. Hence, a balance between distortion and the sense of full-bodied sound can be enhanced.

Here, the details of the above embodiments are summarized as follows.

A signal processing circuit of the present invention includes:

a waveform shaping section that applies a first gain to an input signal and generates a first signal when an absolute value of a level of the input signal falls within a first input range from a first level to a second level higher than the first level, the first gain being smaller than a second gain which is applied to the input signal when the absolute value of the level of the input signal is smaller than the first level;

a variable gain section that adjusts an amplitude of the first signal and amplifies the first signal by a gain to generate an output signal; and a control section that controls the gain of the variable gain section according to a signal from the variable gain section so that the output signal is not clipped, wherein the control section controls to reduce the gain of the variable gain section so that the output signal is not clipped when the amplitude of the first signal falls within a second input range; and wherein the second input range subjected to a gain process of the variable gain section includes a range of the level of the first signal output from the waveform shaping section corresponding to the first input range of the input signal.

According to the present invention, when the absolute value of the level of the input signal falls within the first input range, the waveform shaping section performs processing for reducing the gain thereof. When a peak of a signal waveform of one period of the input signal falls within the first input range, the peak of the signal waveform becomes compressed and flattened. Moreover, the control section controls the gain of the variable gain section such that the output signal is not clipped. The control section controls so as to reduce the gain of the variable gain section within the second input range when an amplitude of the first signal becomes an excessive input. The second input range includes a range of level of the first signal corresponding to the level of the input signal in the first input range. Therefore, when the waveform shaping section performs waveform shaping operation, the variable gain section performs non-clip processing for reducing the gain of the variable gain section. Consequently, waveform shaping and non-clip processing are performed in an overlapping manner. When these processing operations are simultaneously performed, the amplitude of the output signal is limited so as not to cause clipping when the amplitude of the input signal becomes greater, but half bandwidth of the output signal becomes larger. Therefore, a sense of full-bodied sound can be enhanced while distortion of the output signal is suppressed.

In the present invention, the expression "the second input range includes the range of level of the first signal output from the waveform shaping section corresponding to the first input range" means that "the second input range is equal to or broader than the range of the level of the first signal output from the waveform shaping section corresponding to the first input range."

In the signal processing circuit, the first gain may be monotonically decreased in the first input range. According to the present invention, when the input signal falls within the first input range, the gain is monotonically reduced. A monotonous decrease includes a case where an input/output characteristic of the waveform shaping section is given a characteristic of a polygonal line by reducing a gain stepwise and a case where the input/output characteristic of the waveform shaping section is given a characteristic of a curved line by gently reducing the gain. In any event, when the input signal becomes greater, the gain decreases, so that distortion of the first signal can be lessened. The second gain can assume a value of "1."

In the signal processing circuit, the waveform shaping section may have a selection section which switches an input/output characteristic of the waveform shaping section in the first input range according to a type of the input signal. According to a type of the input signal, there are a case where processing placing an emphasis on low distortion than on a sense of full-bodied sound is preferable. Conversely, there is also a case where processing placing an emphasis on a sense of full-bodied sound at a certain amount of expense of distortion is preferable. According to the present invention, the waveform shaping section switches the input/output characteristic in the first input range according to a type of an input signal; hence, a balance between distortion and a sense of full-bodied sound can be accomplished.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japanese Patent Application No. 2010-013872 filed on Jan. 26, 2010, the contents of which are incorporated herein for reference.

What is claimed is:

1. A signal processing circuit comprising:

a waveform shaping section that applies a first gain to an input signal and generates a first signal when an absolute value of a level of the input signal falls within a first input range from a first level to a second level higher than the first level, the first gain being smaller than a second gain which is applied to the input signal when the absolute value of the level of the input signal is smaller than the first level;

a variable gain section that adjusts an amplitude of the first signal and amplifies the first signal by a gain to generate an output signal; and a control section that controls the gain of the variable gain section according to a signal from the variable gain section so that the output signal is prevented from occurrence of clipping, wherein the control section controls to reduce the gain of the variable gain section so that the output signal is prevented from occurrence of clipping when the amplitude of the first signal falls within a second input range; and wherein the second input range includes a range of the level of the first signal output from the waveform shaping section corresponding to the first input range of the input signal.

2. The signal processing circuit according to claim 1, wherein the first gain is monotonically decreased in the first input range.

3. The signal processing circuit according to claim 1, wherein the waveform shaping section has a selection section which switches an input/output characteristic of the waveform shaping section in the first input range according to a type of the input signal.

4. The signal processing circuit according to claim 1, wherein the first gain is generated from a combination of a plurality of resistors and transistors positioned at a feedback stage of an amplifying circuit of the waveform shaping section.

5. The signal processing circuit according to claim 1, wherein the waveform shaping section is configured by an amplifying circuit which enables to select one among a plurality of gains.

6. The signal processing circuit according to claim 1, wherein the first gain is generated from a combination of a plurality of resistors and diodes positioned at a feedback stage of an amplifying circuit of the waveform shaping section.

* * * * *